US010731925B2

(12) United States Patent
Lewis et al.

(10) Patent No.: US 10,731,925 B2
(45) Date of Patent: Aug. 4, 2020

(54) MICROPILLAR-ENABLED THERMAL GROUND PLANE

(71) Applicant: Kelvin Thermal Technologies, Inc., Boulder, CO (US)

(72) Inventors: Ryan John Lewis, Boulder, CO (US); Li-Anne Liew, Westminster, CO (US); Ching-Yi Lin, Longmont, CO (US); Collin Jennings Coolidge, Longmont, CO (US); Shanshan Xu, Boulder, CO (US); Ronggui Yang, Boulder, CO (US); Yung-Cheng Lee, Boulder, CO (US)

(73) Assignee: THE REGENTS OF THE UNIVERSITY OF COLORADO, A BODY CORPORATE, Denver, CO (US)

( * ) Notice: Subject to any disclaimer, the term of this patent is extended or adjusted under 35 U.S.C. 154(b) by 321 days.

(21) Appl. No.: 14/857,567

(22) Filed: Sep. 17, 2015

(65) Prior Publication Data
US 2016/0076820 A1 Mar. 17, 2016

Related U.S. Application Data

(60) Provisional application No. 62/051,761, filed on Sep. 17, 2014, provisional application No. 62/069,564, filed on Oct. 28, 2014.

(51) Int. Cl.
*F28D 15/04* (2006.01)
*F28D 15/02* (2006.01)
(Continued)

(52) U.S. Cl.
CPC ....... *F28D 15/046* (2013.01); *F28D 15/0233* (2013.01); *F28F 21/085* (2013.01);
(Continued)

(58) Field of Classification Search
CPC .... F28D 15/046; F28D 15/04; F28D 15/0233; H05K 7/20336
See application file for complete search history.

(56) References Cited

U.S. PATENT DOCUMENTS 4,000,776 A * 1/1977 Kroebig ................. F28D 15/06
165/104.26
4,274,479 A 6/1981 Eastman
(Continued)

FOREIGN PATENT DOCUMENTS

| JP | H1197871 A | 4/1999 |
| WO | 2008044823 A1 | 4/2008 |
| WO | 2013144444 | 10/2013 |

OTHER PUBLICATIONS

International Search Report and Written Opinion, as issued in connection with International Patent Application No. PCT/US2015/050031, dated Dec. 18, 2015, 10 pgs.
(Continued)

*Primary Examiner* — Frantz F Jules
*Assistant Examiner* — Lionel Nouketcha

(57) ABSTRACT

A thermal ground plane (TGP) is disclosed. A TGP may include a first planar substrate member configured to enclose a working fluid; a second planar substrate member configured to enclose the working fluid; a plurality of wicking structures disposed on the first planar substrate; and one or more planar spacers disposed on the second planar substrate. The first planar substrate and the second planar substrate are may be hermetically sealed.

33 Claims, 19 Drawing Sheets
(11 of 19 Drawing Sheet(s) Filed in Color)

(51) Int. Cl.
| | |
|---|---|
| *F28F 21/08* | (2006.01) |
| *G06F 1/20* | (2006.01) |
| *H01L 23/427* | (2006.01) |
| *H05K 7/20* | (2006.01) |

(52) U.S. Cl.
CPC ............ *G06F 1/203* (2013.01); *H01L 23/427* (2013.01); *F28F 2225/00* (2013.01); *F28F 2240/00* (2013.01); *F28F 2245/02* (2013.01); *F28F 2245/04* (2013.01); *H05K 7/20336* (2013.01)

(56) References Cited

U.S. PATENT DOCUMENTS

| | | | | |
|---|---|---|---|---|
| 4,545,799 | A * | 10/1985 | Rhodes | H01J 61/366 228/193 |
| 4,854,379 | A | 8/1989 | Shaubach et al. | |
| 5,560,423 | A * | 10/1996 | Larson | F28D 15/0241 165/104.26 |
| 5,735,339 | A | 4/1998 | Davenport | |
| 6,056,044 | A | 5/2000 | Benson et al. | |
| 6,158,502 | A | 12/2000 | Thomas | |
| 6,446,706 | B1 | 9/2002 | Rosenfeld et al. | |
| 6,533,029 | B1 | 3/2003 | Phillips | |
| 6,763,671 | B1 | 7/2004 | Klett | |
| 6,912,130 | B2 | 6/2005 | Osanai et al. | |
| 6,938,481 | B2 * | 9/2005 | Paterek | C03C 27/042 73/323 |
| 6,994,151 | B2 | 2/2006 | Zhou et al. | |
| 7,037,400 | B1 | 5/2006 | Shaw | |
| 7,069,978 | B2 | 7/2006 | Rosenfeld et al. | |
| 8,069,907 | B2 * | 12/2011 | Bryant | F28D 15/0241 165/104.33 |
| 8,579,018 | B1 | 11/2013 | Roper et al. | |
| 8,807,203 | B2 | 8/2014 | MacDonald et al. | |
| 9,136,883 | B1 | 10/2015 | Yang et al. | |
| 9,651,312 | B2 | 5/2017 | Yang et al. | |
| 9,835,383 | B1 | 12/2017 | Roper et al. | |
| 9,909,814 | B2 | 3/2018 | Yang et al. | |
| 9,921,004 | B2 | 3/2018 | Lewis et al. | |
| 2001/0054495 | A1 * | 12/2001 | Yevin | F28D 15/02 165/104.26 |
| 2003/0042009 | A1 | 3/2003 | Phillips | |
| 2003/0102118 | A1 | 6/2003 | Sagal et al. | |
| 2003/0136547 | A1 | 7/2003 | Gollan et al. | |
| 2003/0136551 | A1 | 7/2003 | Bakke | |
| 2003/0159806 | A1 | 8/2003 | Sehmbey et al. | |
| 2004/0011509 | A1 | 1/2004 | Siu | |
| 2004/0131877 | A1 | 7/2004 | Hasz et al. | |
| 2005/0059238 | A1 | 3/2005 | Chen et al. | |
| 2005/0126757 | A1 | 6/2005 | Bennett et al. | |
| 2005/0230085 | A1 * | 10/2005 | Valenzuela | F28D 15/0233 165/104.26 |
| 2005/0280128 | A1 * | 12/2005 | Mok | H01L 23/427 257/678 |
| 2005/0280162 | A1 | 12/2005 | Mok et al. | |
| 2006/0090882 | A1 | 5/2006 | Sauciuc | |
| 2006/0098411 | A1 | 5/2006 | Lee | |
| 2006/0124280 | A1 | 6/2006 | Lee et al. | |
| 2006/0131002 | A1 | 6/2006 | Mochizuki et al. | |
| 2006/0196640 | A1 | 9/2006 | Siu | |
| 2006/0196641 | A1 * | 9/2006 | Hong | F28D 15/046 165/104.26 |
| 2006/0213648 | A1 | 9/2006 | Chen et al. | |
| 2006/0283574 | A1 | 12/2006 | Huang | |
| 2006/0283576 | A1 | 12/2006 | Lai et al. | |
| 2007/0035927 | A1 | 2/2007 | Erturk et al. | |
| 2007/0056714 | A1 | 3/2007 | Wong | |
| 2007/0068657 | A1 | 3/2007 | Yamamoto et al. | |
| 2007/0077165 | A1 | 4/2007 | Hou et al. | |
| 2007/0089864 | A1 | 4/2007 | Chang et al. | |
| 2007/0107875 | A1 * | 5/2007 | Lee | H01L 23/427 165/104.26 |
| 2007/0158050 | A1 | 7/2007 | Norley | |
| 2008/0017356 | A1 | 1/2008 | Gruss et al. | |
| 2008/0111151 | A1 | 5/2008 | Teraki et al. | |
| 2008/0128898 | A1 | 6/2008 | Henderson et al. | |
| 2008/0210407 | A1 | 9/2008 | Kim et al. | |
| 2008/0272482 | A1 * | 11/2008 | Jensen | H01L 23/04 257/705 |
| 2009/0020272 | A1 | 1/2009 | Shimizu | |
| 2009/0056917 | A1 | 3/2009 | Majumdar et al. | |
| 2009/0236080 | A1 | 9/2009 | Lin et al. | |
| 2009/0294104 | A1 | 12/2009 | Lin et al. | |
| 2009/0316335 | A1 | 12/2009 | Simon et al. | |
| 2010/0053899 | A1 | 3/2010 | Hashimoto et al. | |
| 2010/0084113 | A1 | 4/2010 | Lee | |
| 2010/0139767 | A1 | 6/2010 | Hsieh et al. | |
| 2010/0200199 | A1 | 8/2010 | Habib et al. | |
| 2010/0252237 | A1 | 10/2010 | Hashimoto et al. | |
| 2010/0290190 | A1 | 11/2010 | Chester et al. | |
| 2010/0300656 | A1 | 12/2010 | Lu | |
| 2011/0017431 | A1 * | 1/2011 | Yang | F28D 15/046 165/104.26 |
| 2011/0083829 | A1 | 4/2011 | Hung et al. | |
| 2011/0120674 | A1 * | 5/2011 | MacDonald | F28D 15/046 165/104.26 |
| 2011/0198059 | A1 | 8/2011 | Gavillet et al. | |
| 2011/0205708 | A1 | 8/2011 | Andry et al. | |
| 2012/0061127 | A1 | 3/2012 | Fields et al. | |
| 2012/0186784 | A1 * | 7/2012 | Yang | F28D 15/0266 165/104.21 |
| 2012/0189839 | A1 | 7/2012 | Aoki et al. | |
| 2012/0241216 | A1 * | 9/2012 | Coppeta | A61K 9/0097 174/94 R |
| 2013/0049018 | A1 | 2/2013 | Ramer et al. | |
| 2013/0199770 | A1 | 8/2013 | Cherian | |
| 2013/0269913 | A1 * | 10/2013 | Ueda | F28D 15/0233 165/104.26 |
| 2013/0327504 | A1 * | 12/2013 | Bozorgi | F28D 15/04 165/104.26 |
| 2014/0009883 | A1 * | 1/2014 | Fujiwara | G06F 1/203 361/679.48 |
| 2014/0238646 | A1 | 8/2014 | Enright | |
| 2015/0226493 | A1 | 8/2015 | Yang et al. | |
| 2016/0076820 | A1 | 3/2016 | Lewis et al. | |
| 2016/0081227 | A1 | 3/2016 | Lee et al. | |

OTHER PUBLICATIONS

International Search Report and Written Opinion, as issued in connection with International Patent Application No. PCT/US2015/050771, dated Dec. 18, 2015, 8 pgs.
U.S. Office Action in U.S. Appl. No. 12/719,775, dated Nov. 9, 2012, 15 pgs.
U.S. Office Action in U.S. Appl. No. 12/719,775, dated May 9, 2013, 15 pgs.
U.S. Office Action in U.S. Appl. No. 12/719,775, dated Oct. 2, 2013, 15 pgs.
U.S. Office Action in U.S. Appl. No. 12/719,775, dated Mar. 26, 2014, 23 pgs.
U.S. Office Action in U.S. Appl. No. 12/719,775, dated Feb. 6, 2015, 24 pgs.
U.S. Notice of Allowance in U.S. Appl. No. 12/719,775, dated Aug. 4, 2015, 8 pgs.
U.S. Office Action in U.S. Appl. No. 14/681,624, dated Oct. 23, 2015, 11 pgs.
U.S. Office Action in U.S. Appl. No. 14/925,787, dated Aug. 9, 2017, 15 pgs.
International Search Report and Written Opinion dated Jul. 15, 2016 in related PCT Application No. PCT/US2015/57885 (11 pages).
U.S. Office Action in U.S. Appl. No. 14/681,624, dated May 5, 2016, 10 pgs.
U.S. Notice of Allowance in U.S. Appl. No. 14/681,624, dated Nov. 17, 2016, 7 pgs.
International Search Report and Written Opinion dated Jan. 17, 2018 in related PCT Application No. PCT/US2017/060550 (11 pages).

(56) References Cited

OTHER PUBLICATIONS

U.S. Office Action in U.S. Appl. No. 14/925,787 dated Sep. 28, 2017, 9 pages.
U.S. Office Action in U.S. Appl. No. 14/861,708 dated May 9, 2017, 8 pages.
U.S. Notice of Allowance in U.S. Appl. No. 14/861,708 dated Oct. 25, 2017, 9 pages.
U.S. Office Action in U.S. Appl. No. 14/853,833 dated Oct. 6, 2017, 12 pages.
U.S. Notice of Allowance in U.S. Appl. No. 14/925,787, dated Nov. 9, 2017, 7 pages.
U.S. Restriction Requirement in U.S. Appl. No. 14/853,833 dated Aug. 30, 2017, 7 pages.
U.S. Office Action in U.S. Appl. No. 14/853,833 dated Nov. 19, 2018, 11 pages.
U.S. Restriction Requirement in U.S. Appl. No. 15/436,632 dated Oct. 10, 2018, 5 pages.
U.S. Restriction Requirement in U.S. Appl. No. 15/292,932 dated Aug. 30, 2018, 5 pages.
International Search Report and Written Opinion, as issued in connection with International Patent Application No. PCT/US2018/31632, dated Oct. 15, 2018, 16 pgs.
U.S. Office Action in U.S. Appl. No. 15/787,455 dated Sep. 27, 2018, 13 pages.
U.S. Office Action in U.S. Appl. No. 14/853,833 dated Apr. 25, 2018, 11 pages.
U.S. Office Action in U.S. Appl. No. 15/292,932 dated Dec. 11, 2018, 12 pages.
U.S. Office Action in U.S. Appl. No. 15/806,723 dated Apr. 5, 2019, 11 pages.
U.S. Office Action in U.S. Appl. No. 14/857,567 dated Mar. 21, 2019, 27 pages.
U.S. Office Action in U.S. Appl. No. 14/853,833 dated Mar. 29, 2019, 27 pages.
U.S. Office Action in U.S. Appl. No. 15/292,932 dated Mar. 29, 2019, 13 pages.
U.S. Office Action in U.S. Appl. No. 15/436,632 dated Feb. 5, 2019, 9 pages.
U.S. Office Action in U.S. Appl. No. 15/787,455 dated Apr. 1, 2019, 19 pages.

\* cited by examiner

*(Section A)*

*(Section B)*

*(Section C)*

MICROPILLAR-ENABLED THERMAL GROUND PLANE

CROSS-REFERENCE TO RELATED APPLICATIONS

This application is a non-provisional of U.S. Provisional Patent Application No. 62/051,761, filed Sep. 17, 2014, titled MICROPILLAR-ENABLED THERMAL GROUND PLANE; and a non-provisional of U.S. Provisional Patent Application No. 62/069,564, filed Oct. 28, 2014, titled POLYMER-BASED MICROFABRICATED THERMAL GROUND PLANE, each of which are incorporated into this disclosure by reference in their entireties.

SUMMARY

A thermal ground plane (TGP) is disclosed. The TGP may include a first planar substrate member configured to enclose a working fluid; a second planar substrate member configured to enclose the working fluid; a plurality of wicking structures disposed on the first planar substrate; and one or more planar spacers disposed on the second planar substrate. The first planar substrate and the second planar substrate are may be hermetically sealed.

In some embodiments, the plurality of wicking structures comprise a plurality of pillars or channels disposed on the first planar substrate member and the plurality of wicking structures comprise a plurality of pillars or channels formed on the second planar substrate member.

In some embodiments, the first planar substrate member and/or the second planar substrate member comprise a metallic layer, a copper-cladded polymer layer with thermal vias, a copper-cladded polymer layer without thermal vias, a polymer-coated copper layer, a metallic layer encapsulated by a hydrophilic coating, a copper metallic layer encapsulated by a hydrophilic hydrophobic coating, and/or a polymer layer encapsulated by a metallic layer, a polymer layer encapsulated by a hydrophilic coating, and/or a polymer layer encapsulated by a hydrophobic coating. In some embodiments, the first planar substrate member (e.g., a metal cladding layer) and/or the second planar substrate member may be thicker in one or more regions such as, for example, regions near the evaporator or the condenser.

In some embodiments, the plurality of wicking structures comprise a plurality of copper pillars bonded with a mesh layer.

In some embodiments, the a plurality of wicking structures may comprise a material with at least one property selected from the list consisting of copper mesh, stainless steel mesh, metal mesh, polymer mesh, copper-encapsulated mesh, a mesh encapsulated by a hydrophilic coating, a mesh encapsulated by a hydrophobic coating, and a mesh encapsulated by a hermetic seal.

In some embodiments, the plurality of wicking structures comprise copper pillars bonded with a stainless steel mesh encapsulated by copper or a copper mesh.

In some embodiments, the one or more planar spacers comprise copper pillars bonded with a stainless steel mesh encapsulated by copper or a copper mesh.

In some embodiments, the one or more planar spacers comprise a plurality of copper pillars or channels.

In some embodiments, the one or more planar spacers comprise a plurality of pillars or channels with various star-shaped cross sections, such as rectangular, circular, and/or star-shaped.

In some embodiments, the plurality of wicking structures comprise polymer pillars hermetically sealed by copper or other coatings, and/or enhanced with a hydrophilic coating or a hydrophobic coating.

In some embodiments, the plurality of wicking structures comprise a mesh layer. The mesh layer, for example, may include a mesh selected from the list consisting of copper mesh, stainless steel mesh, metal mesh, polymer mesh and copper-encapsulated mesh. The mesh layer, for example, may include a hydrophilic coating or a hydrophobic coating or hermetic coating.

In some embodiments, the plurality of wicking structures and/or the one or more planar spacers are deposited using a lithographic patterning process.

In some embodiments, the hermetical seal can be an ultrasound-welded, an electrostatic-welded, or a laser-welded copper-to-copper interface.

In some embodiments, the hermetical seal can include a seal selected from the list consisting of a copper-silver sintered interface, a tin/lead solder, and a lead-free solder alloy.

A thermal ground plane (TGP) is disclosed. The TGP may include a top layer; a mesh layer comprising a plurality of arteries formed along a length of the mesh layer; and a bottom layer comprising a plurality of pillars that extend into the plurality of arteries. The bottom layer and the top layer may be sealed around at least one edge of the top layer and at least one edge of the bottom layer. Each of the plurality of pillars may have at least one dimension that is less than a dimension of at least one of the plurality of arteries.

In some embodiments, the plurality of arteries may be cut from the mesh layer. In some embodiments, the TGP may include a micro-wick layer disposed on the bottom layer. In some embodiments, the TGP may include a plurality of pillars disposed on the top layer.

BRIEF DESCRIPTION OF THE FIGURES

These and other features, aspects, and advantages of the present disclosure are better understood when the following Detailed Description is read with reference to the accompanying drawings. The patent or application file contains at least one drawing executed in color. Copies of this patent or patent application publication with color drawing(s) will be provided by the Office upon request and payment of the necessary fee.

DETAILED DESCRIPTION

Figure 1:
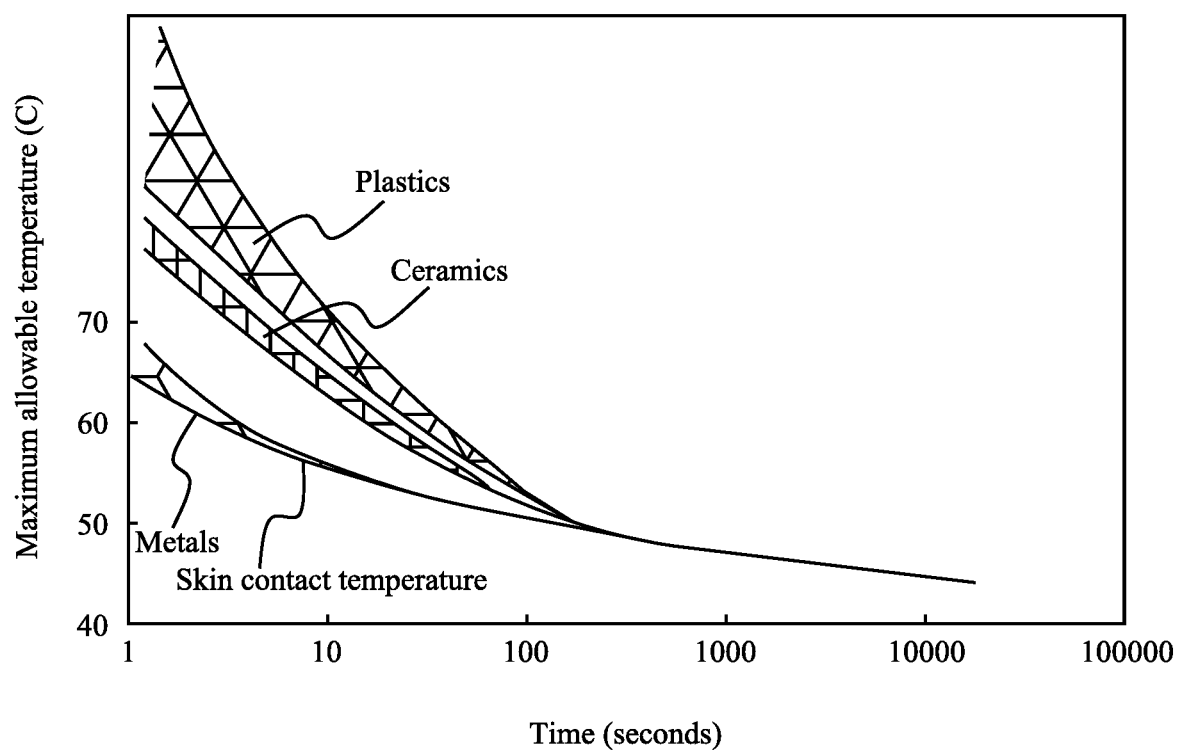
FIG. 1 is a graph illustrating the maximum allowable surface temperatures of a mobile system using different materials with different contact duration.

One challenge for mobile systems, e.g., smartphones, tablets and wearable electronics, is the control of the skin temperatures. The skin temperature is the temperature of an exterior portion of a device (e.g., the case) that is touched by fingers, hands, face, ears, or any other part of a human body. When the temperature of a portion of a device reaches beyond the maximum allowable temperature, a user would consider the temperature of the device to be hot. Of course, this perception of heat is dependent on the materials and the duration of the contact; it also varies from one person to another one due to their difference in thermal physiology. FIG. 1 illustrates a graph of acceptable skin temperatures for a number of different materials considering different touch duration.

Figure 2:
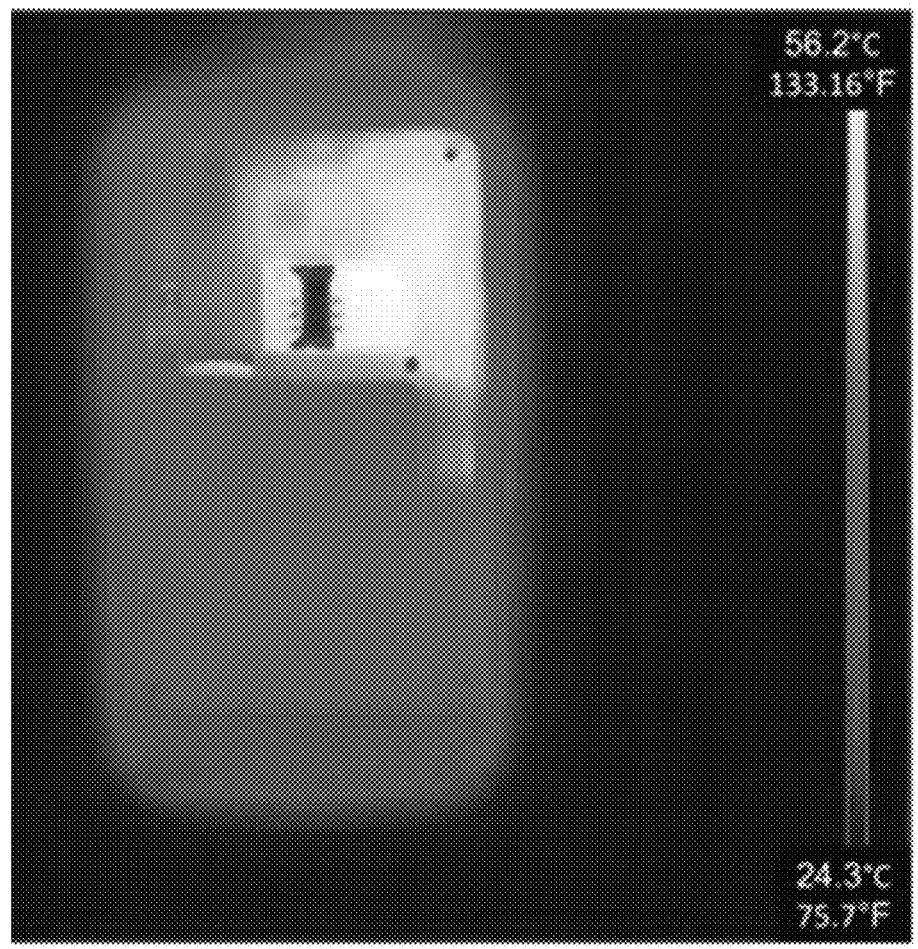
FIG. 2 is an example infrared image of illustrating a non-uniformly heated mobile device without effective heat spreading according to some embodiments.

As illustrated in FIG. 2, a hot spot or region with a much higher temperature than other locations on a smart phone (or other device) could be generated by an electronic chip such as, for example, a 5-Watt processor or a 1-Watt, small-size wireless amplifier. These hot spots or regions could be removed by effective heat spreading since the temperatures in the area outside these hot spots can be much lower.

Typically, a metal heat spreader, such as, for example, an aluminum or copper heat spreader, may be effective. However, the thickness of the metal heat spreader is being reduced in order to meet the demand for the reduction of the total system's thickness. For most mobile systems, a thinner configuration is usually desirable. With a thin metal heat spreader, its thermal resistance increases since it is affected by the thermal conductivity and cross-section area for heat conduction. Alternative approaches can use high thermal conductivity graphite heat spreaders. However, the thermal conductivity of graphite heat spreaders generally decreases with the thickness of the graphite layer. The high thermal conductivity graphite, e.g., thermal conductivity of 1,500 W/mK, is too thin, e.g., 0.017 mm, to be effective to transfer heat over a large area.

Some embodiments include a thin thermal ground plane (TGP) with improved thermal performance. For example, a TGP may use phase-change heat transfer mechanisms with an evaporation-vapor transport-condensation-liquid return path for heat transfer. As another example, a TGP may be a very good heat spreader with effective thermal conductivities higher than that of a copper (see FIG. 5). In some embodiments, a TGP may include components and/or may be manufactured with processes described in U.S. patent application Ser. No. 12/719,775, entitled "Flexible Thermal Ground Plane and Manufacturing the Same," which is incorporated herein in its entirety for all purposes.

Embodiments may also include a top layer including a plurality of spacers (or pillars) sealed with a bottom layer having a plurality of pillars. In some embodiments, the spacers may be deposited on the top layer using a lithographic patterning process. In some embodiments, the pillars may be deposited on the bottom layer using a lithographic patterning process. In some embodiments, the pillars and spacers may be bonded or scribed on the first and/or second planar substrate. In some embodiments, the pillars may have a diameter that is less than or greater than the diameter of the pillars and/or spacers. In some embodiments, the spacers pillars may have a spacing that is less than or greater than the spacing diameter of the pillars. In some embodiments, the pillars in the spacers may have a height, diameter or spacing that is less than or greater than the spacing of the pillars in the wicking structure.

Figure 3:
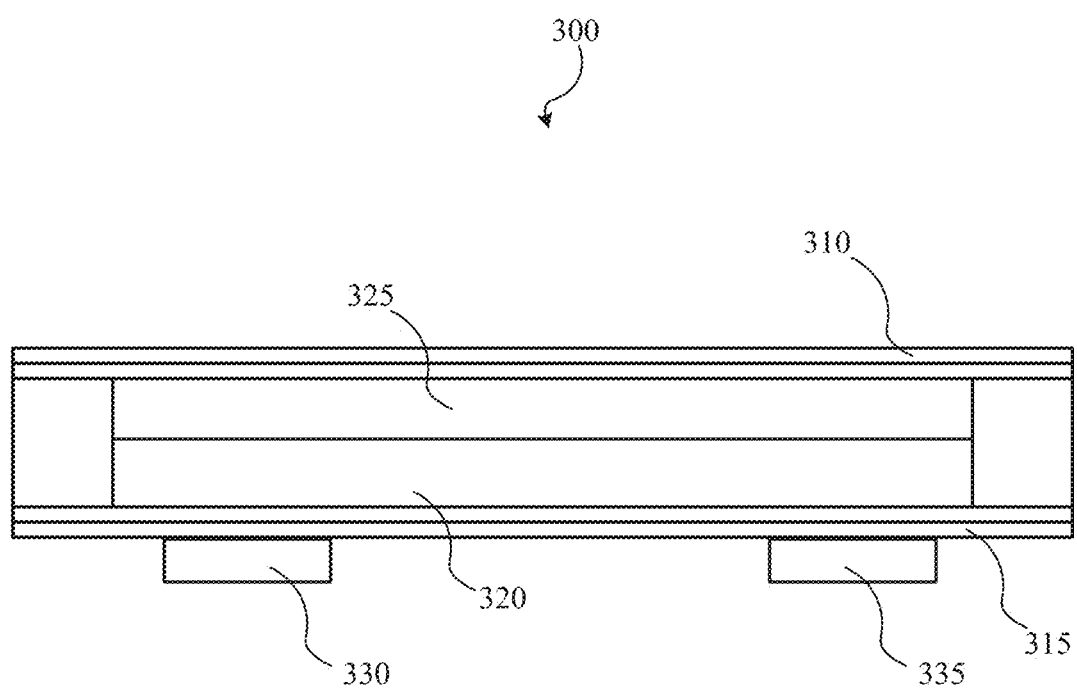
FIG. 3 illustrates an example diagram of a thermal ground plane (TGP) according to some embodiments.

FIG. 3 illustrates a diagram of an example TGP 300 according to some embodiments. In this example, the TGP 300 includes a top layer 310, a bottom layer 315, a liquid channel 320, and/or a vapor core 325. The TGP 300, for example, may operate with evaporation, vapor transport, condensation, and/or liquid return of water or other cooling media for heat transfer between the evaporation region 330 and the condensation region 335. The top layer 310 may include copper, polyimide, polymer-coated copper, copper-cladded Kapton, etc. The top bottom layer 315 may include copper, polyimide, polymer-coated copper, copper-cladded Kapton, etc. In some embodiments, the top layer 310 and the bottom layer 315 of the TGP may be sealed together using solder, laser welding, ultrasonic welding, electrostatic welding, or thermo-pressure compression or a sealant 340.

In some embodiments, the liquid channel 320 may include copper mesh, stainless-steel mesh, or meshes made of other materials but encapsulated with copper. The liquid channel 320, for example, may include one, two, three, four, five, six or more layers of mesh of the same or different materials. In some embodiments, the liquid channel 320 may be bonded and/or sealed using FEP (fluorinated ethylene propylene), electroplating, sintering, and/or other adhesives or sealants with the top layer 310. In some embodiments, in order to enhance hydrophilic properties of the metallic mesh, atomic layer deposition (ALD) of $Al_2O_3$, $TiO_2$, $SiO_2$, or other coatings may be used to encapsulate meshes of the liquid channel 320 with desirable functionality.

In some embodiments, the vapor core 325 may include a plurality of pillars and/or channels disposed on the top layer 310. The pillars and/or channels may be deposited using any type of deposition technique such as, for example, vapor deposition, etc.

Figure 4:
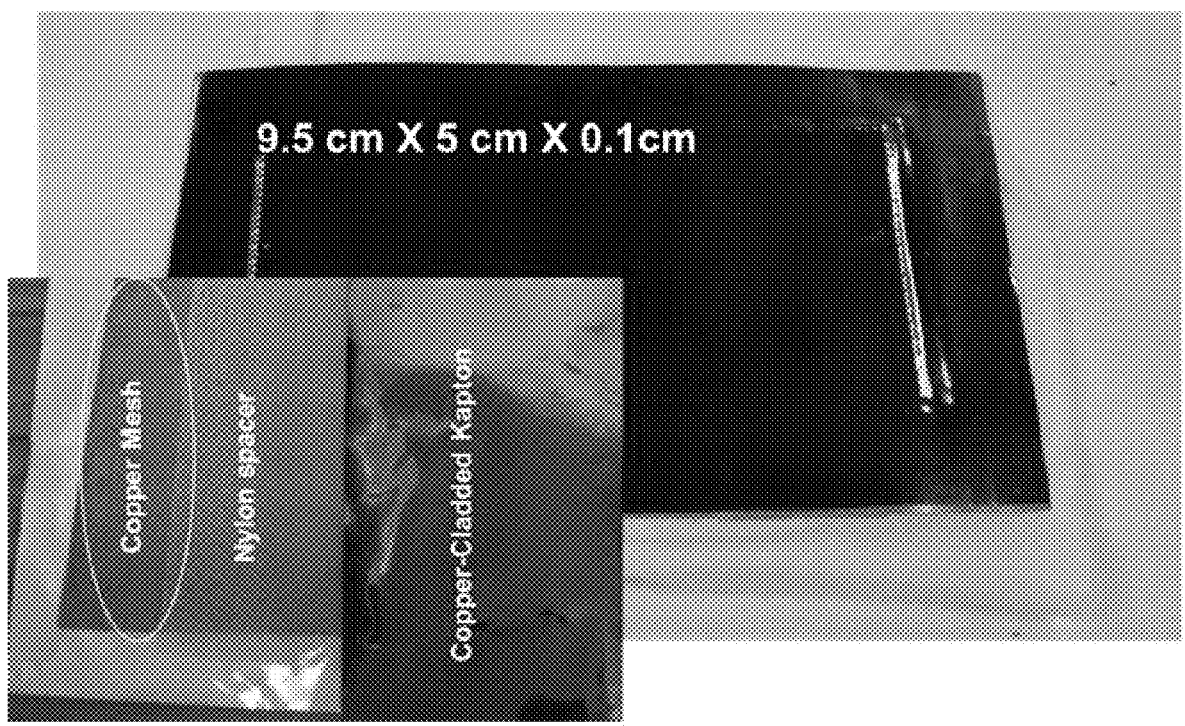
FIG. 4 illustrates examples of flexible thermal ground planes according to some embodiments.

FIG. 4 illustrates examples of flexible thermal ground planes according to some embodiments. The TGPs may include may an active region of various sizes, for example, the TGP may have at least one dimension (e.g., length, width, radius, diameter, etc.) that is less than 2 cm, 5 cm, 10 cm, 20 cm, 50 cm, 100 cm, 500 cm, 1000 cm, etc. and/or a thickness less than 0.1 mm, 0.25 mm, 0.5 mm, 1 mm, 10 mm 50 mm, 100 mm, etc. In a specific example, the active region may have dimensions of 9.5 cm×5 cm×0.1 cm.

In some embodiments, a TGP may include a copper-cladded Kapton bottom layer and a copper-cladded Kapton top layer with a copper or metallic mesh and/or a polymer spacer sandwiched in between. The metallic mesh may be copper mesh, stainless-steel mesh with or without a copper coating, or meshes made of other materials but encapsulated with copper. The copper mesh layer, for example, may include one, two, three, four, five, six or more layers of mesh. In some embodiments, portions of the TGP (e.g., the copper mesh and/or the polymer spacer) may be bonded and sealed using FEP (fluorinated ethylene propylene), electroplating, sintering, and/or other sealants. In some embodiments, in order to enhance hydrophilic properties of the metallic mesh, atomic layer deposition (ALD) of $Al_2O_3$, $TiO_2$, $SiO_2$, or other coatings may be used to encapsulate the meshes with desirable functionality.

Figure 5:
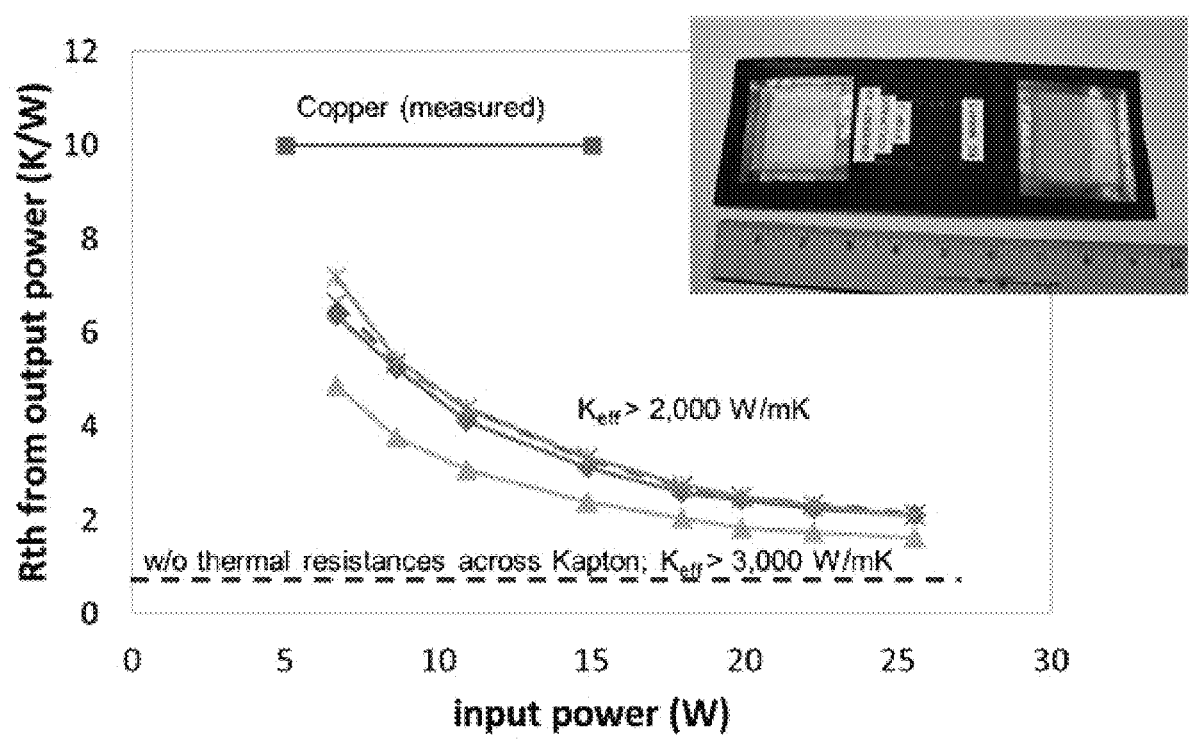
FIG. 5 illustrates the thermal resistance from an evaporation region to a condensation region of a TGP according to some embodiments calibrated with a 1 inch by 1 inch heater injecting heat to the TGP and 1 inch by 1 inch heat sink extracting heat from the TGP.

FIG. 5 illustrates the thermal resistance from the evaporator evaporation region to the condensation region of a TGP manufactured according to some embodiments. In this example, the TGP includes is characterized with a 1 inch by 1 inch heater injecting the heat to the TGP and a 1 inch by 1 inch heat sink extracting the heat from the TGP. In this example, the active region of the test sample is about 200 mm×50 mm×1 mm. The results are compared with those obtained for a copper reference sample with the same dimensions.

In some embodiments, the TGP may include a layer having a plurality of pillars manufactured with electroplating processes that produces, for example, large bonding pads with copper-nickel-gold layers. Additionally or alternatively, in some embodiments, an ALD hydrophilic or hydrophobic coating process may be used to change the wettability of the pillars.

As shown in FIG. 5, the thermal resistances of a TGP manufactured according to embodiments are compared with those of a copper reference sample with the same dimensions. The thermal resistance from the evaporator to the condenser is a function of input power of the heater. As shown in the graph, the thermal resistance drops from 7 K/W to about 2 K/W when the power increases from 5 to 25 Watts. The corresponding thermal resistance of the copper sample is about 10 K/W. The effective thermal conductivity of the TGP reaches about 2,000 W/mK at 25 Watts since its resistance is about ⅕ of the copper with the thermal conductivity of 400 W/mK. In another test, our customer ran the power all the way to 35 Watts and reached the effective thermal conductivities up to 4,000 to 7,000 W/mK.

In some embodiments, thermal vias with higher thermal conductivity than the substrate materials may be used. However, thermal vias were not used in this sample which was used to create generate the illustration results shown in the graph in FIG. 5; therefore, there is a relatively large and undesirable thermal resistance across the 50-um thick Kapton layer due to the low thermal conductivity of Kapton. With the use of thermal vias, the total thermal resistance of the TGP may increase with an effective thermal conductivity over 3,000 W/mK even at the 25-Watt power level.

Figure 6:
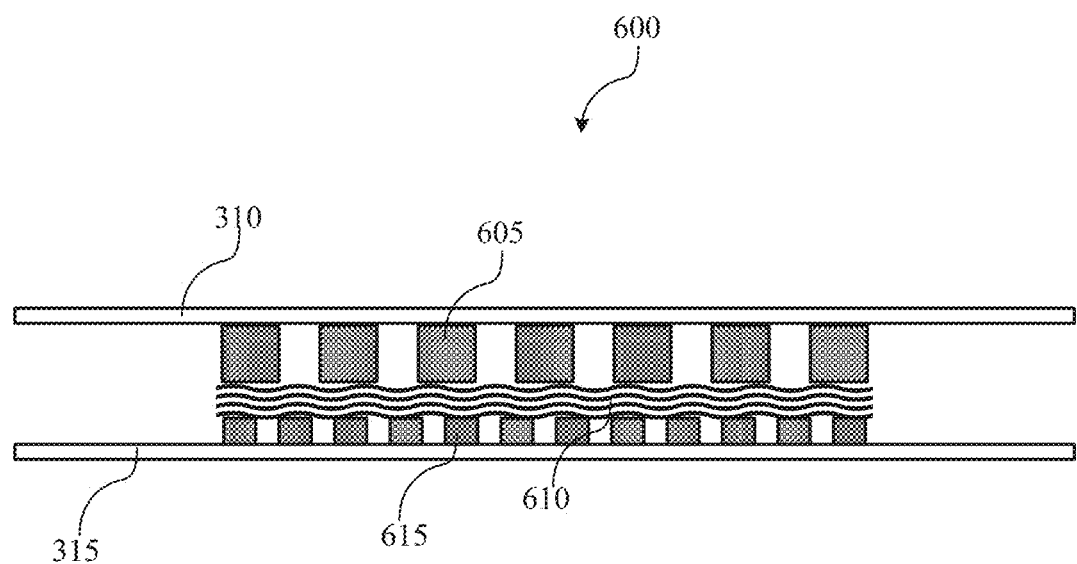
FIG. 6 illustrates a TGP according to some embodiments.

FIG. 6 illustrates a TGP 600 according to some embodiments. In this example, the top layer 310 and/or the bottom layer 315 may include copper cladded Kapton and/or may be similar to the top layer 310 and the bottom layer 315 described above in conjunction with FIG. 3. In some embodiments, the top layer 310 and the bottom layer 315 of the TGP 600 may be sealed together using solder, laser welding, ultrasonic welding, electrostatic welding, or thermo-pressure compression. In between the top layer 310 and the bottom layer 315 the TGP 600 may include a liquid channel, a wicking structure, and/or a vapor core.

The wicking structure 610, for example, may include a copper mesh, stainless-steel mesh with or without a copper coating, or one or more mesh made of other materials but encapsulated with copper. The wicking structure 610, for example, may include one, two, three, four, five, six or more layers of mesh of the same or different material. In some embodiments, the wicking structure 610 may be bonded and/or sealed using FEP (fluorinated ethylene propylene) electroplating, sintering, and/or other adhesives or sealants with the top layer 310. In some embodiments, in order to enhance hydrophilic properties of the wicking structure 610, atomic layer deposition (ALD) of $Al_2O_3$, $TiO_2$, $SiO_2$, or other coatings may be used to encapsulate meshes of the liquid channel 615 with desirable functionality. In some embodiments, the wicking structure 610 may be bonded with or on a plurality of pillars of the liquid channel 615.

In some embodiments, the wicking structure 610 may include a woven mesh that may be bonded to the pillars of the liquid channel 615 and/or the vapor core 605 through an electroplating process. In some embodiments, the mesh may be a copper woven mesh or a metallic mesh. During this process, for example, the wicking structure 610 (e.g., woven mesh) may be encapsulated by copper. The top layer 310 with the vapor core 605 and the bottom layer 315 with the liquid channel 615 may be sealed together with the wicking structure 610 with a mesh in between. After sealing, the TGP 600 may be charged with a working fluid, such as water, methane, ammonia, or other coolants or refrigerants that are compatible with the surfaces exposed to the working fluid.

The liquid channel 615, for example, may include a plurality of pillars (e.g., electroplated pillars).

The vapor core 605, for example, may include a plurality of pillars (e.g., electroplated pillars). In some embodiments, the pillars in the vapor core 605 may have at least one dimension (e.g., height, width, length, diameter, etc.) that is smaller than at least one dimension (e.g., height, width, length, diameter, etc.) of the pillars of the liquid channel 615.

In some embodiments, a photo-lithographic patterning process may be used to fabricate the pillars in the liquid channel 615 and/or the vapor core 605. For example, a photo-lithography process may be used to form a plurality of pillars on the top layer 310 to form the vapor core 605 and/or a photo-lithographic patterning process may be used to form a plurality of pillars on the bottom layer 315 to form the liquid channel 615. The photo-lithographic patterning process, for example, may control the positioning and/or the heights of the pillars with a resolution of a few microns. The plurality of pillars on the top layer 310 and/or on the bottom layer 315 may be formed by the mechanical scribing process.

In some embodiments, the thickness of a TGP (e.g., TGP 300 or TGP 600, or any other TGP described in this disclosure) may be a few millimeters or even less than about 500, 450, 400, 350, 300, 250, 200, 150, or 100 microns. For example, the top layer 310 and/or the bottom layer 315 may be 10, 20, 30, 40, 50, 60, etc. microns thick, the liquid channel (e.g., liquid channel 615) may be 5, 10, 20, 30, 40, 50, 60, etc. microns thick, the wicking structure (e.g., wicking structure 610) may be 5, 10, 20, 30, 40, 50, 60, etc.

microns thick, and/or the vapor core (e.g., vapor core 605) may be 10, 20, 30, 40, 50, 75, 100, 125, 150, etc. microns thick.

Figure 7:
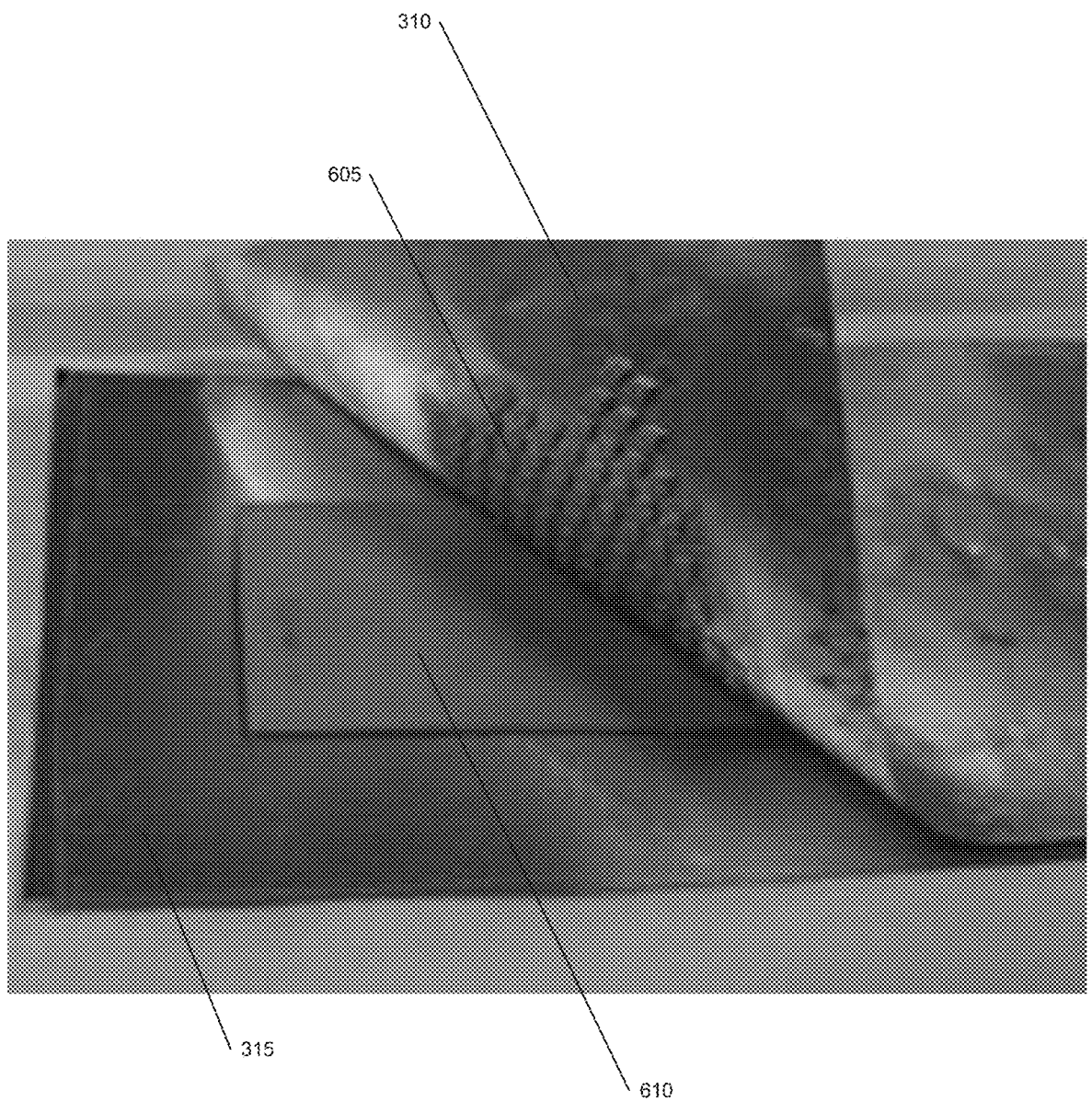
FIG. 7 shows a TGP with a top layer having pillars formed therein, a bottom layer having pillars formed therein, and a wicking structure according to some embodiments.

FIG. 7 shows an example of a TGP 600 with a top layer 310 having pillars formed thereon to form the vapor core 605, a bottom layer 315 having pillars formed thereon to form the liquid channel 615 and a wicking structure 610 disposed in between according to some embodiments.

Figure 8:
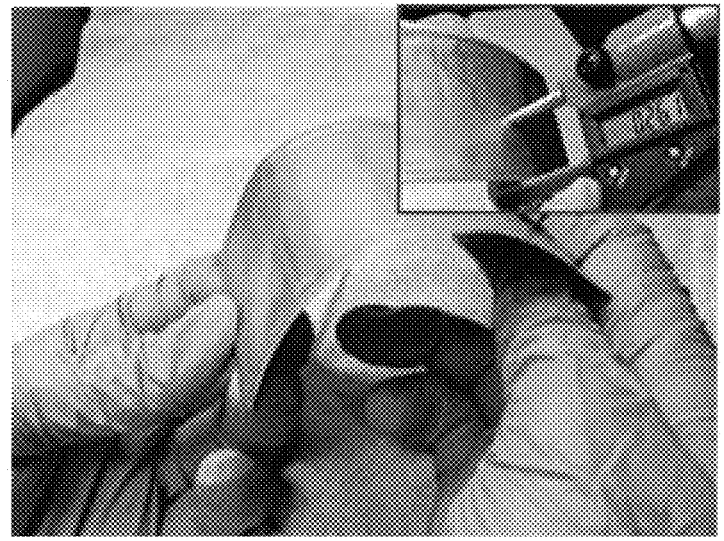
FIG. 8 illustrates the thinness of TGPs manufactured according to some embodiments.
Figure 8:

In some embodiments, the pillars may be fabricated using electroplating over photo-lithography-defined openings. In some embodiments, TGPs manufactured according to some embodiments may have a thickness larger than or less than 0.25 mm as shown in FIG. 8. The total thickness can be reduced further since all dimensions of critical features are defined by the photo-lithography processes. In some embodiments, TGPs may have a thickness less than about 0.25, 0.2, 0.15, 0.1, 0.05 mm, etc.

In some embodiments, the pillars of the liquid channel 615 and/or the vapor core 605 may allow the TGP to remain effective under different mechanical loadings even in an extremely thin configuration.

Figure 9:
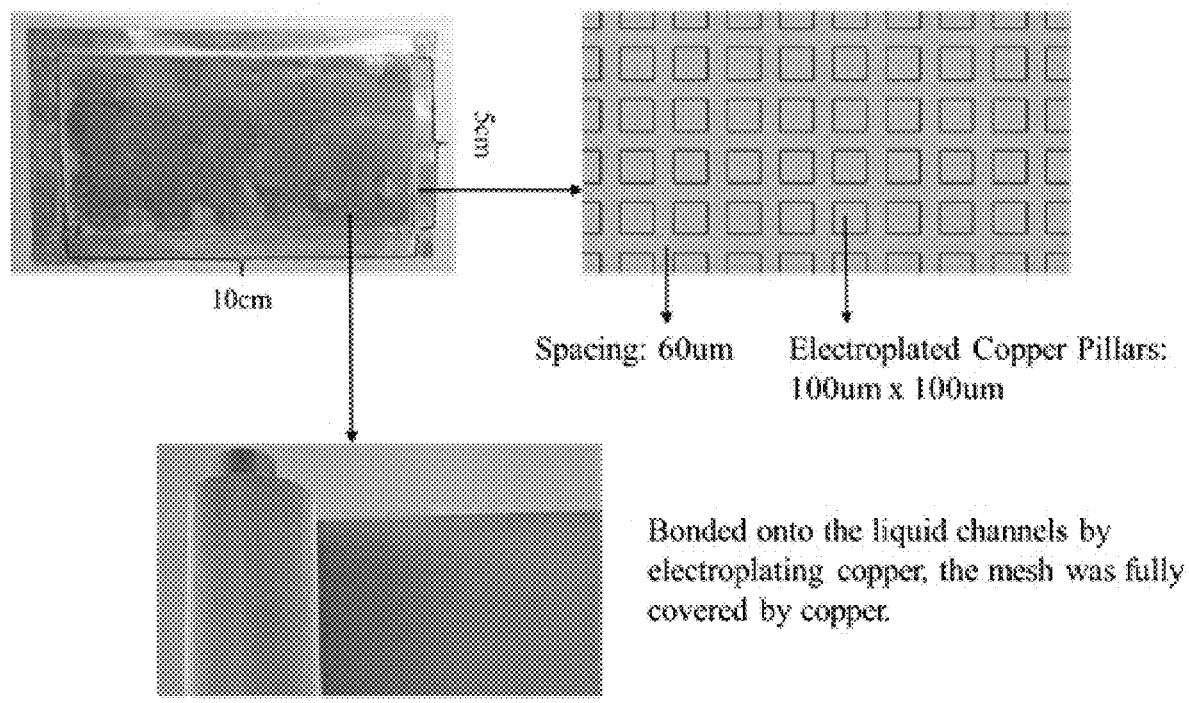
FIG. 9 illustrates an example TGP having a bottom layer with copper pillars electroplated and bonded with a copper-coated stainless steel mesh according to some embodiments.

FIG. 9 illustrates an example TGP with a plurality of electroplated pillars and mesh according to some embodiments. For example, the pillars on the top layer and/or the bottom layer may be fabricated using a photo-lithographic patterning process and/or may have any dimension such as, for example, 100 um×100 um squares with 60 um spacing in between each square. These pillars, for example, may be bonded to a stainless steel woven mesh (e.g., having 500 wires/inch, 50 um thick) through various bonding techniques such as, for example, copper electroplating. The mesh, for example, may also be at least partially or completely encapsulated by electroplated copper.

In some embodiments, the combined mesh-pillar structure may achieve low capillary radius (or high pumping pressure) in the evaporation regions and higher flow hydraulic radius (or low flow pressure drop) in the fluid channel.

In some embodiments, a controlled over-plating process may be used to form the pillars with rounded heads. In some embodiments, this shape may be beneficial, for example, to form a sharp angle of each interface between a pillar and the mesh bonded. These sharp angles, for example, may enhance the capillary pumping force pulling the liquid returned from the condenser to the evaporator.

Figure 10:
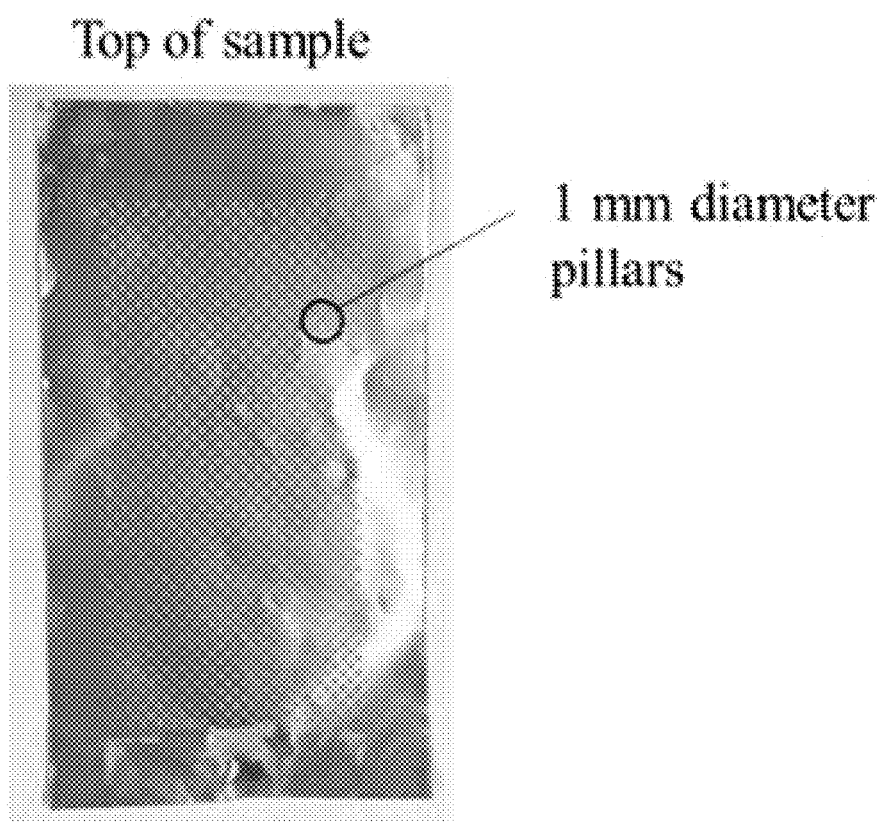
FIG. 10 shows a top layer with a plurality of copper pillars according to some embodiments.

FIG. 10 shows an example top layer with copper pillars electroplated through a photolithography-defined opening according to some embodiments. In this example, the height of the pillars is 100 microns, the diameter (or width) of the pillars is 1 mm, and the spacing between the pillars is 2 mm. In this example, the pillars may define the gap of the vapor core. With large spacing (e.g., a spacing between pillars that is greater than the diameter of the individual pillars or a spacing between pillars that is greater than or equal to twice the diameter of the individual pillars) the flow resistance may be reasonably low.

In some embodiments, the pillars formed on the top layer and/or on the bottom layer may be hydrophilic. In some embodiments, the pillars may have a cross section that is round; oval; polygonal; star shaped as shown, for example, in FIG. 6; hexagonal; octagonal; pentagonal; square; rectangular; triangular; etc. In some embodiments, condensation of vapor can occur along the vapor core. In some embodiments, the hydrophilic property of the pillars in the vapor core can reduce the size of vapor droplets or bubbles. In some embodiments, the star-shaped pillars can further enhance the hydrophilic properties or wettability.

In some embodiments, the pillars may be constructed from material other than copper. The pillars, for example, may be manufactured from polymer using photo-lithographic deposition and etching techniques. Such polymer pillars, for example, can be baked, followed by hermetic encapsulation with copper, ALD moisture barrier coating or other sealing materials. In some embodiments, the thermal conductivities of polymer pillars may be much lower than that of copper.

In some embodiments, the process of manufacturing a TGP may include a removing air out of the TGP followed by charging the TGP with water or other working fluid that is compatible with an exposed TGP inner surface. In some embodiments, a small diameter copper tube may be coupled with the TGP to allow for vacuuming and/or charging. After water charging, for example, this tube can be pinch-sealed. In some embodiments, the pinch-sealed tube can be removed by an additional seal separating the active region from the region with the tube.

Figure 11:
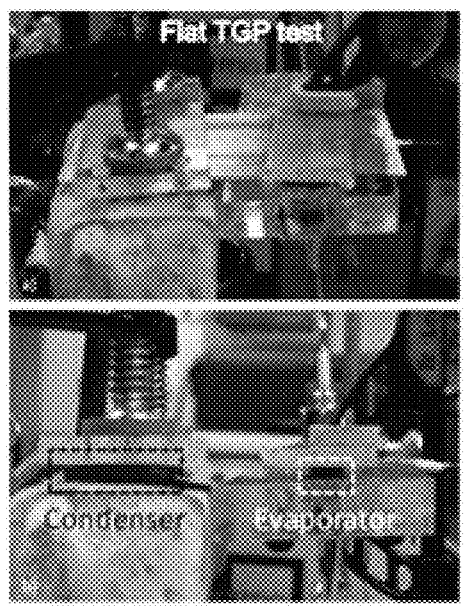
FIG. 11 shows an experimental setup that can be used to characterize the properties of a thin flexible TGP with a condensation region defined by a cold plate according to some embodiments.
Figure 11:
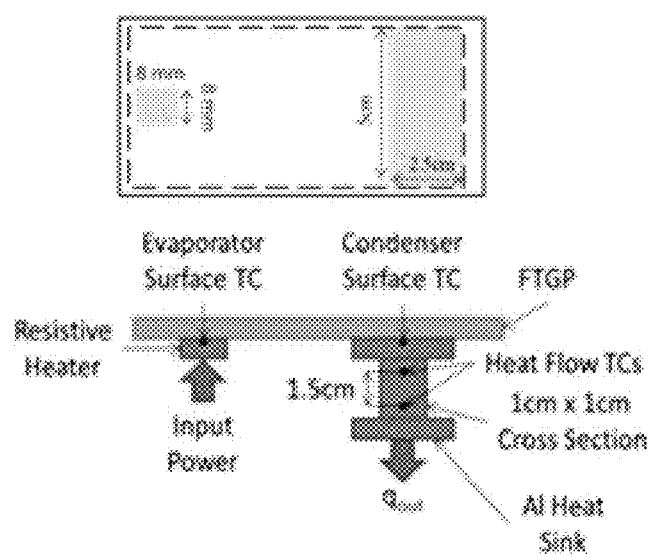

FIG. 11 shows an experimental setup that can be used to characterize the properties of a thin flexible TGP according to some embodiments. In this example, the evaporator (e.g., heater) region was defined by the heater size was of 8 mm×8 mm and the condensation region was defined by the condenser block was with an area of 5 cm×2.5 cm. The temperature difference between the evaporator evaporation region and the condenser condensation region was measured, and this difference per unit of heat transferred to the condenser heater's input power was used to calculate considered the thermal resistance. The entire setup was covered by thermal insulation to reduce air natural convection effect by air.

Figure 12:
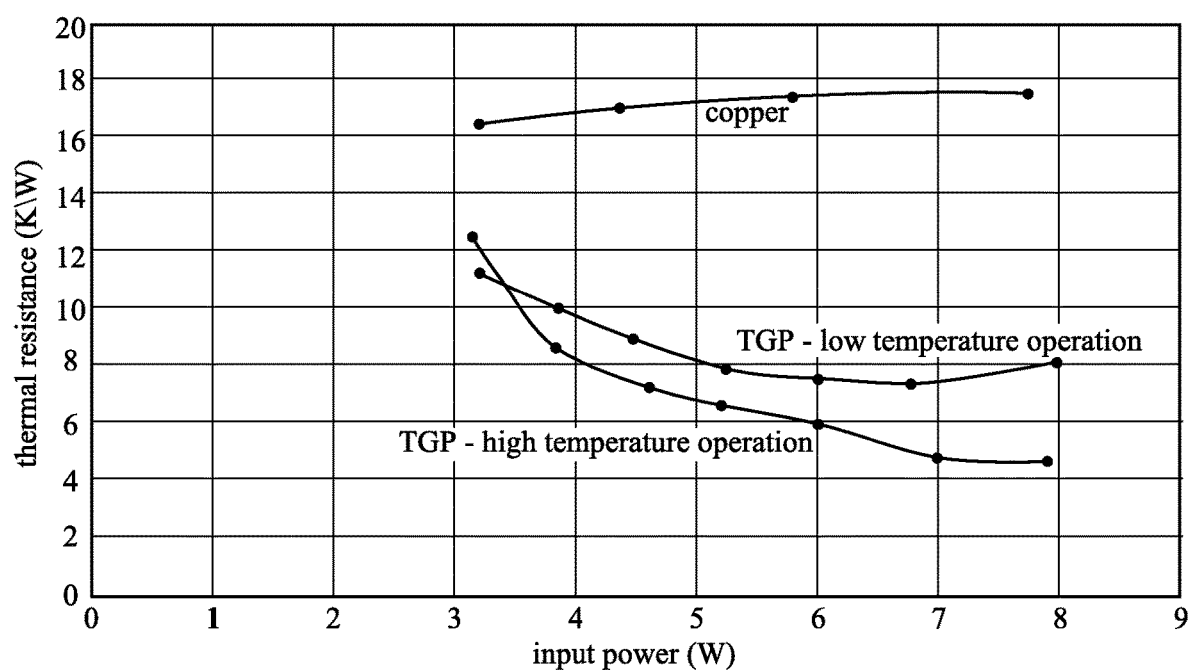
FIG. 12 is a graph showing the thermal resistances of a TGP manufactured according to some embodiments and using the experimental setups shown in FIG. 11.

FIG. 12 is a graph showing the thermal resistances as a function of heater's input power of a TGP manufactured according to some embodiments and using the experimental setups shown in FIG. 11. As shown in the figures, TGPs manufactures manufactured according to embodiments outperform copper. From these results, the thin TGP's, effective thermal conductivity may be between 500 and 5,000 W/mK or 1,000 and 1,500 W/mK.

Figure 13:
FIG. 13 shows an experimental setup that can be used to characterize the properties of a thin flexible TGP with distributed condensers condensation where the heat is extracted by nature air convection according to some embodiments.

In some embodiments, the location of heat extraction condensation may affect a TGP's performance. FIG. 13 shows an experimental setup that can be used to characterize the properties of a thin flexible TGP with distributed condensers condensation cooled by air nature air convection without an active cooling heat sink according to some embodiments. In the Figure, a 1 inch×1 inch heater placed at the center of each sample's bottom side with wicking layer attached, the temperature difference between an upper region and the center (the heated region) on the top side with spacer layer attached was about 0.6° C. for the TGP sample with 4 W input. This temperature difference was increased to 5.4° C. for the copper sample with the same 4 W input. With distributed condensation over a large area, comparing to copper, the heat spreading performance of the TGP's was improved significantly, even without an active heat sink.

Figure 14A:
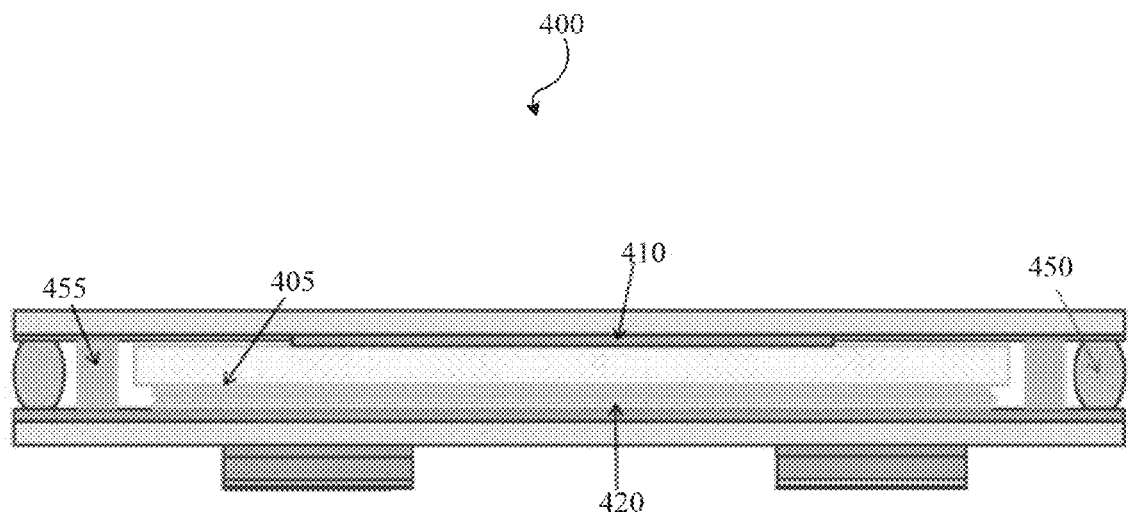
FIG. 14A illustrates another example TGP according to some embodiments.

FIG. 14A illustrates a TGP 400 according to some embodiments. TGP 400 may be constructed with any of the following configurations. For example, the material on the interior surface exposed to water may be copper. As another example, a stainless steel mesh 405 may be used that is encapsulated by copper. As another example, a copper mesh can be used. As another example, the spacer 420 for the vapor core may be defined by a polymer mesh such as, for example, a nylon mesh or a PEEK mesh in conjunction with or in addition to copper pillars. In addition the spacer 420 may be a copper mesh. In some embodiments, one or more copper cladded Kapton layers 410 and 420 may be included. In some embodiments, a wicking layer 405 may be included. One or more layers may be combined and/or bonded together.

Figure 14B:
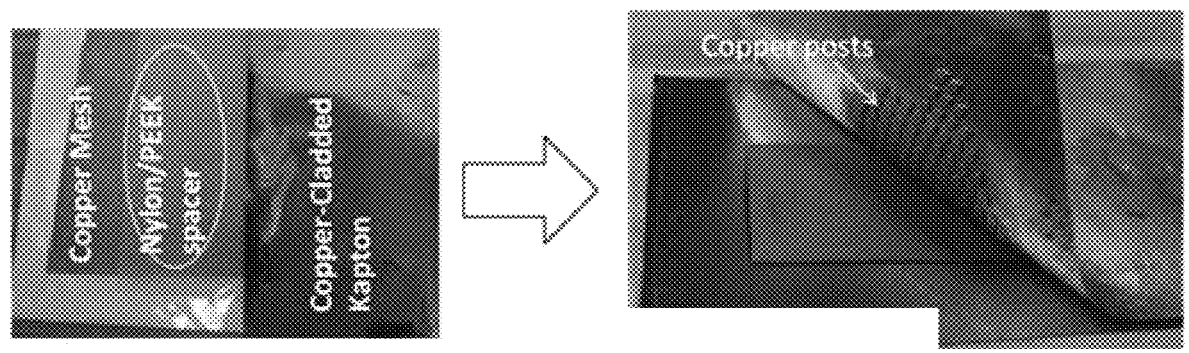
FIG. 14B shows a TGP according to some embodiments.

FIG. 14B shows an example TGP according to some embodiments. In this example, a plurality of meshes (e.g., a copper mesh and a nylon/peek spacer) may be sealed between copper cladded Kapton layers.

The bottom layer and/or the top layer may be assembled and/or sealed with one or more sealing techniques such as, for example, ultrasound welding, laser welding, pressure thermo-compression between two layers and/or with a solder seal to form a high-yield hermetic seal. Any other technique may be used to hermetically seal the TGP such as, for example, photolithography-defined solder masking, copper-to-copper seam welding including ultrasonic welding or laser welding, copper-silver sintering, solder dipping, etc. In this example, a first seal 455 and a second seal 455 may be used.

Figure 15:
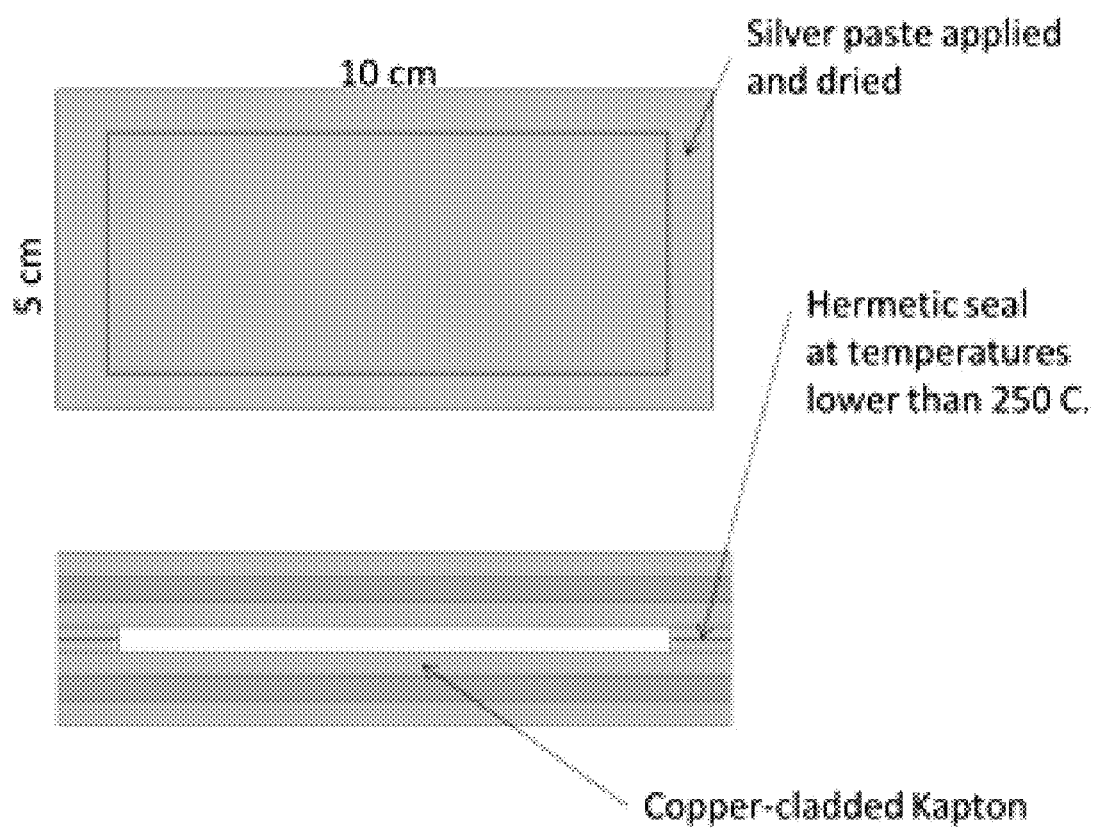
FIG. 15 illustrates another example TGP according to some embodiments.

FIG. 15 illustrates another example TGP according to some embodiments. In this example, a bottom layer of copper cladded Kapton and a top layer of copper cladded Kapton can be bonded by copper silver sintering using a silver paste. The silver paste, in some embodiments, may allow for lower temperature soldering or sintering. For example, silver paste may be used for bonding at 250° C. without any pressure applied. In some embodiments, the copper surface may be treated with gold, silver and/or palladium. In some embodiments, the organic binder in the paste may be removed by a drying process before sintering.

Figure 16:
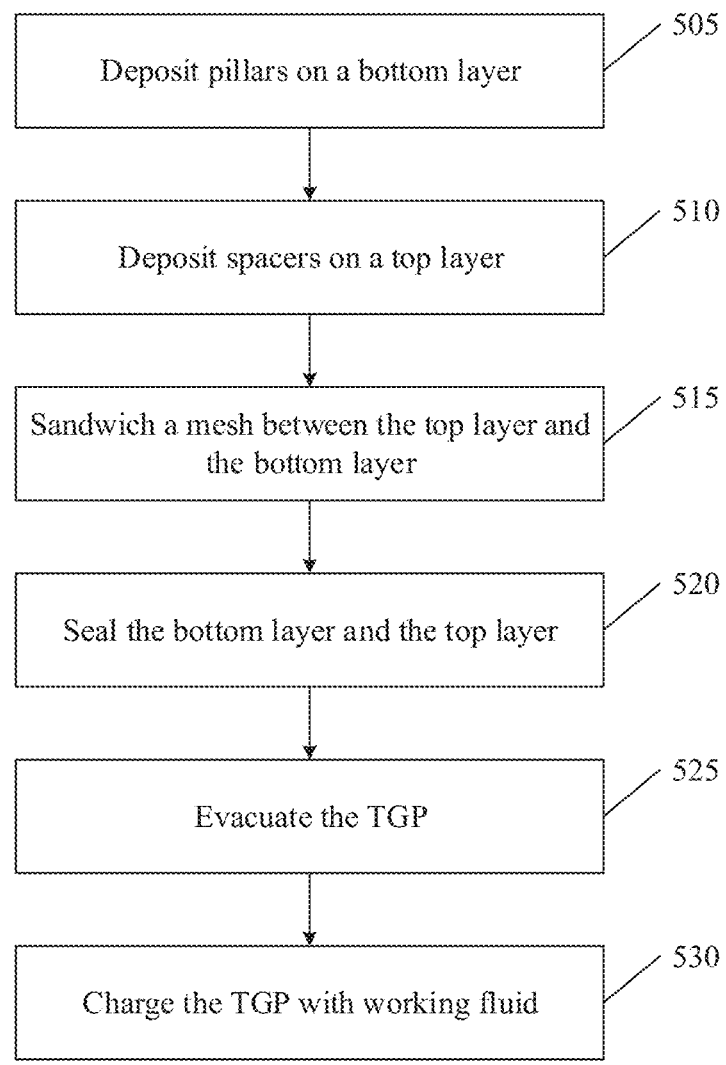
FIG. 16 illustrates an example process for fabricating a TGP according to some embodiments.

FIG. 16 illustrates an example process for fabricating a TGP according to some embodiments. At block 505, a plurality of pillars may be formed on a bottom layer. These pillars, for example, may be used to form a liquid layer or channels. The pillars may be formed using any type of lithographic patterning process or mechanical scribing process. The pillars may have a height less than a millimeter, a diameter of less than 5 millimeters, and a spacing between pillars that is greater than the diameter of the individual pillars. The pillars may be metal and/or polymers based, and/or include a hydrophilic coating or a hydrophobic coating.

At block 510, a plurality of spacers may be formed on a top layer. These spacers, for example, may be used to form a vapor core layer. The spacers may be formed using any type of lithographic patterning process. The spacers may have a height less than a millimeter, a diameter of less than 5 millimeters, and a spacing between pillars that is greater than the diameter of the individual pillars. In some embodiments, the spacers may have a diameter of less than the diameter of the pillars and/or a space between pillars that is greater than the diameter of the individual pillars. The spacers may be metal and/or polymer based and/or encapsulated by copper and/or include a hydrophilic coating and/or include a hydrophobic coating.

At block 515, a mesh layer may be sandwiched between the top layer and the bottom layer. The mesh may be a metal mesh, a metal-encapsulated mesh, or a copper-encapsulated stainless steel mesh. The mesh may be a woven mesh. The woven mesh, for example, may have a weave that is less than 75 microns in thickness. In some embodiments, the mesh may be copper encapsulated. In some embodiments, the mesh may have a desirable wettability with hydrophilic or hydrophobic coatings. In some embodiments, the reaction of the mesh with water may be negligible. In some embodiments, the mesh can be bonded to the bottom layer by electroplated copper.

At block 520 the top layer and the bottom layer may be sealed to create a void cavity within which a working fluid may be placed. Any type of sealing may be used including those described herein and those not described herein. A tube may extend through the sealing to allow evacuation and charging of the TGP.

At block 525 any air or non-condensable gas or other material within the void may be evacuated using any technique. At block 530 the TGP may be charged with a working fluid such as, for example, water, methane, ammonia, or other working fluid that is compatible with the exposed TGP inner surface.

The various steps in the process shown in FIG. 16 may occur in any order and/or any block may be removed.

In some embodiments, a TGP may be sealed with tin/lead solder (or similar lead-free solder alloys) according to some embodiments. Tin/lead solder's reaction with water may be limited.

Figure 17:
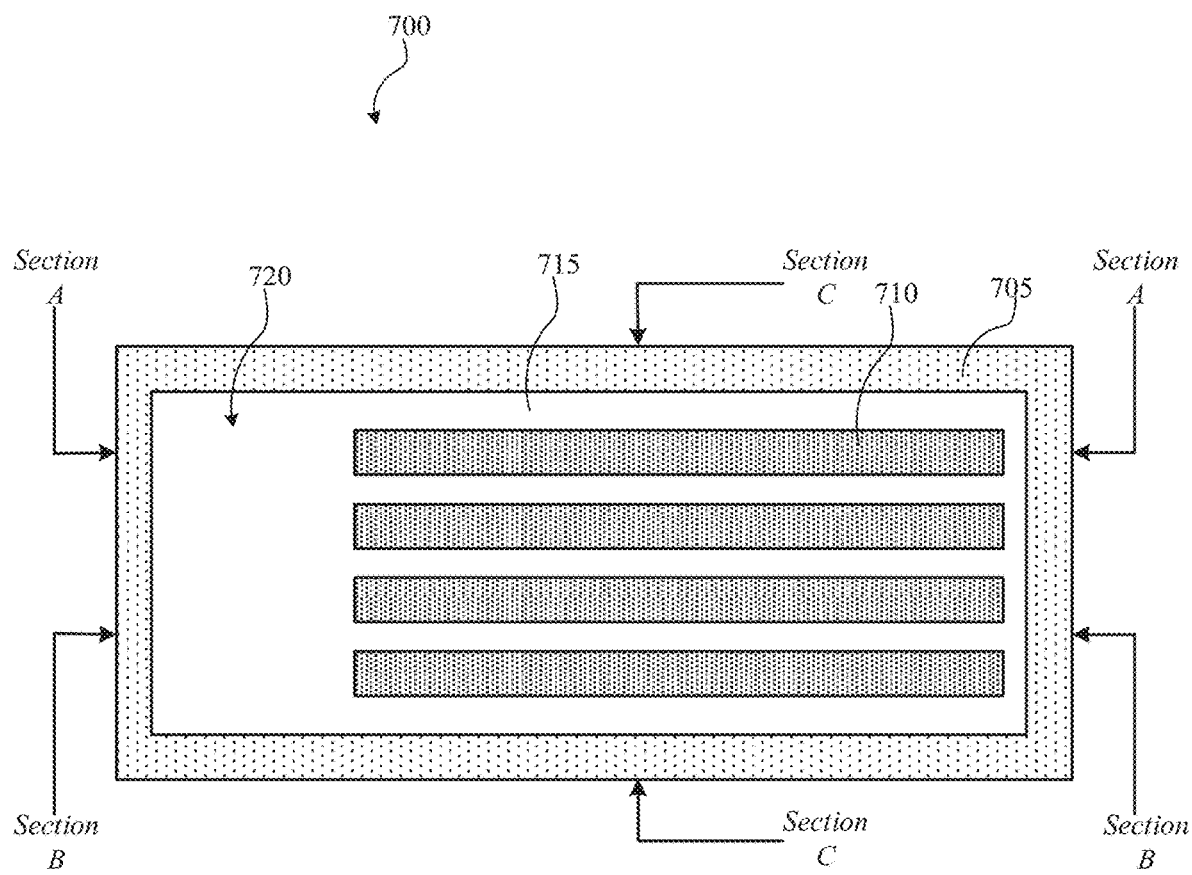
FIG. 17 illustrates a top view of another TGP 700 according to some embodiments.
Figure 18A:
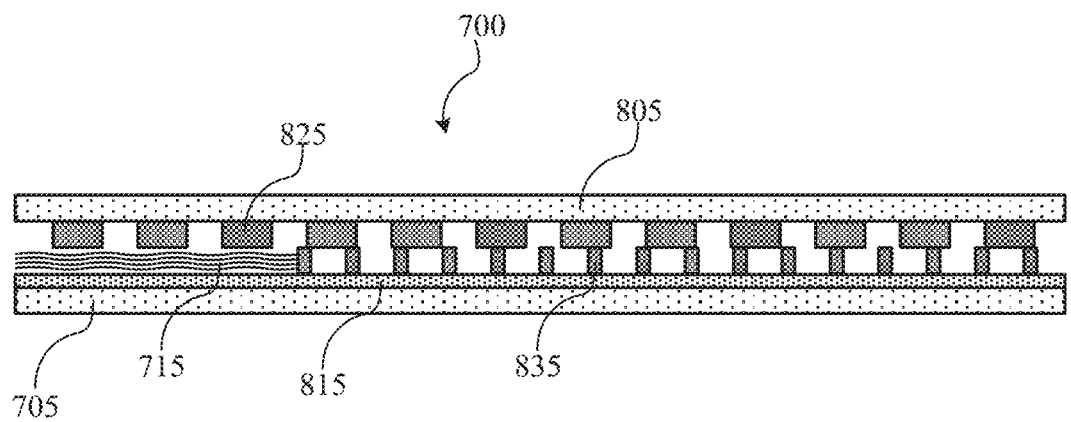
FIGS. 18A, 18B, and 18C illustrate side views of the TGP shown in FIG. 17 according to some embodiments.
Figure 18B:
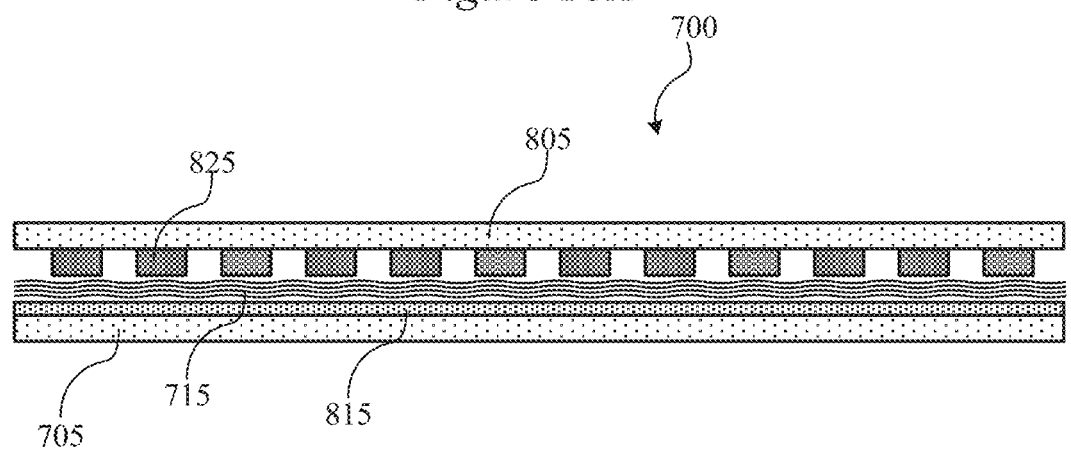
Figure 18C:
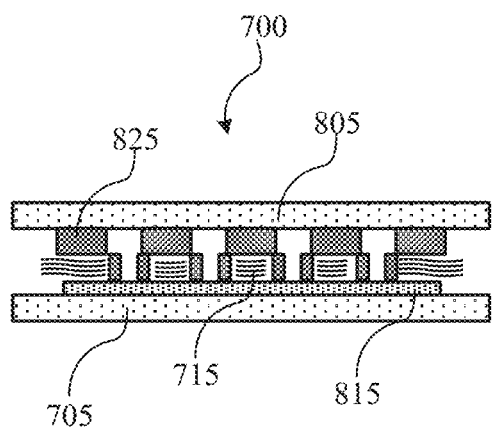

FIG. 17 illustrates a top view of another TGP 700 and FIGS. 18A, 18B, and 18C illustrate side views of the TGP 700 according to some embodiments. The TGP 700 includes a top layer (805 in FIG. 18) and a bottom layer 705. FIG. 17 shows the TGP 700 with the top layer 805 removed. The top layer 805 and/or the bottom layer 705 may include copper and/or polyimide material. In some embodiments, the top layer 805 and/or the bottom layer 705 may include layers of both copper and polyimide.

The TGP 700 includes a mesh return layer 715 that includes a plurality of return arteries 710 formed or cut within the mesh return layer 715. In some embodiments, the return arteries 710 may not extend into the evaporator region 720 of the TGP 700. In some embodiments, the width of the return arteries 710 may be less than 30 microns. In some embodiments, the width of the return arteries 710 may be less than 100 microns. In some embodiments, the mesh return layer 715 may include a wick. In some embodiments, the mesh return layer 715 may include a steel mesh such as, for example, a mesh with wires that are less than 50 microns or 25 microns thick. In some embodiments, the mesh return layer 715 may include a mesh with a simple weave at 200, 300, 400, 500, 600, 700, etc. wires/inch. In some embodiments, the mesh return layer 715 may be electroplated with copper. The mesh return layer 715 may include a specified evaporator region that may provide a specific location for a heat source. In some embodiments, the mesh return layer 715 may have a thickness of about 40 microns.

The mesh return layer 715 may have any number of shapes and/or configurations. In some embodiments, the mesh return layer 715 may have a polygonal or circular shape. In some embodiments, the mesh return layer 715 may have multiple sections without return arteries 710. In some embodiments, the mesh return layer 715 may include any number, shape or configuration of return arteries 710. In some embodiments, the return arteries 710 may have one or more pillars or other mechanisms disposed within the return arteries 710.

In some embodiments, return pillars 835 (see FIG. 18) may extend from the bottom layer 705 through the return arteries 710 of the mesh return layer 715. In some embodiments, the return pillars 835 may form vapor regions running parallel to the mesh return layer 715. In some embodiments, the return pillars 835 may form arteries in the adiabatic and/or condenser regions of the TGP 700.

The return pillars 835 may have at least one dimension that is smaller than the width of the return arteries 710. In some embodiments, these pillars may have at least one dimension (e.g., height, width, length, diameter, etc.) that is less than 10 microns. In some embodiments, these pillars may have at least one dimension (e.g., height, width, length, diameter, etc.) that is less than 50 microns. In some embodiments, these pillars may have at least one dimension (e.g., height, width, length, diameter, etc.) that is less 100 microns.

FIG. 18A shows a side view of TGP 700 cut through Section A shown in FIG. 17. In FIG. 18A, the TGP 700 is cut through a region where a return arteries 710 extends along a portion of the mesh return layer 715. As shown in FIG. 18A, the mesh return layer 715 is present in the evaporator region. The return pillars 835 are shown extending through the return arteries 710. The TGP 700 also includes a plurality of top pillars 825 disposed on the top layer 805. The top pillars 825 may have at least one dimension (e.g., height, width, length, diameter, etc.) that is larger than the return pillars 835. The top pillars 825 may have at least one dimension (e.g., height, width, length, diameter, etc.) that is larger than 0.25 mm, 0.5 mm, 0.75 mm, 1.0 mm, 1.25 mm, etc.

In some embodiments, the TGP 700 may include a micro wick layer 815. The micro wick layer 815, for example, may include a plurality of pillars (e.g., electroplated pillars). The micro wick layer 815 may have at least one dimension (e.g., pillar height, width, length, diameter, pitch, etc.) that is smaller than the return pillars 835. The micro wick layer 815 may have at least one dimension (e.g., height, width, length, diameter, etc.) that is smaller than 5 µm, 10 µm, 15 µm, 20 µm, 25 µm, etc. The micro wick layer 815 may be aligned with the return arteries 710.

FIG. 18B shows a side view of TGP 700 cut through Section B shown in FIG. 17. In FIG. 18B, the TGP is cut through a region without the return arteries 710 extending along a portion of the mesh return layer 715. Instead, the mesh return layer 715 extends along the length of the TGP 700 along this section of the TGP 700.

FIG. 18C shows an end view of TGP 700 cut through Section C shown in FIG. 17. In FIG. 18C, the TGP is cut through the mesh return layer 715 showing both the mesh return layer 715 and the return arteries 710 formed in the mesh return layer 715. In some embodiments, the return pillars 835 may extend through the return arteries 710. In some embodiments, one or more of the return pillars 835 may contact one or more of the top pillars 825.

In some embodiments, the top layer 805 and the bottom layer 705 are sealed along at least one edge of the top layer 805 and along at least one edge of the bottom layer 705. In some embodiments, the top layer 805 and the bottom layer 705 are sealed along at least two edges of the top layer 805 and along at least two edges of the bottom layer 705.

In some embodiments, a buffer region can be created by design to collect and store any non-condensable gas through passive convection. For example, a space of a few millimeters can be formed in the area outside the mesh (e.g., outside the mesh region shown in FIG. 6). This space can be added prior to bonding. This space may collect any non-condensable gases that would move to this space because of its different density, and thus its effect on evaporation and condensation can be reduced substantially.

Various other sealing techniques may be used such as, for example, thermosonic or thermo-compression bonding, ultrasonic welding, laser welding, electron beam welding, electroplating, solder sealing with alloys with negligible reaction with water, and polymer bonding encapsulated by moisture barrier coatings such as atomic layer deposition (ALD)-based coatings.

Some embodiments may include a pillar-enabled TGP. In some embodiments, the TGP may include a copper-cladded Kapton film that includes three layers. These layers may, for example, include copper and Kapton layers. Each layer may be about 12 um thick. In some embodiments, a stainless steel woven mesh may be included and may have a thickness less than 75 um. In some embodiments, the pillars may allow for fluid and/or vapor transport between the pillars under different mechanical loadings.

In some embodiments, a plurality of pillars may be formed on a copper layer (e.g., the top layer and/or the bottom layer) using any of various lithography lithographic patterning processes.

In some embodiments, a copper-encapsulated stainless steel mesh may be sandwiched between the top layer and the bottom layer. The stainless steel mesh, for example, may have a weave that is less than 75 microns in thickness. In some embodiments, the mesh may be copper encapsulated. In some embodiments, the mesh may be hydrophilic. In some embodiments, the reaction of the mesh with water may be negligible.

In some embodiments, a TGP may include a mesh-pillar wicking structure. The mesh-pillar wicking structure may allow the TGP to achieve a low capillary radius (high pumping pressure) in the evaporation regions and/or a higher flow hydraulic radius (low flow pressure drop) in the fluid channel.

In some embodiments, a TGP may include pillars with rounded heads. For example, the pillars may be formed with controlled over-plating. In some embodiments, the pillars may form very sharp angle at the interface between a pillar and the mesh bonded. In some embodiments, these sharp angles may be used, for example, to enhance the capillary pumping force pulling the liquid returned from the condenser to the evaporator.

In some embodiments, a plurality of star-shaped pillars may be constructed on either the top layer and/or the bottom layer that have a star-shaped polygon various cross section.

In some embodiments, a plurality of hydrophilic pillars may be constructed on either the top layer and/or the bottom layer.

In some embodiments, heat rejection through condensation can be distributed throughout the external surface of the TGP.

In some embodiments, pillars and/or spacers may be disposed on a layer with densities (spacing between pillars or spacers) that vary across the layer, with diameters that vary across the layer, with spacing that vary across the layer, etc.

The Figures are not drawn to scale.

Figure 19:
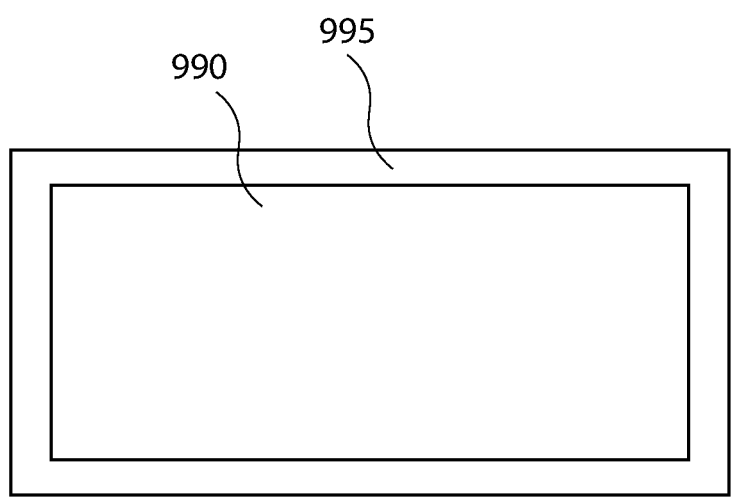
FIG. 19 is a block diagram showing a wicking structure comprising a mesh layer according to some embodiments.

In some embodiments, as shown in FIG. 19, the plurality of wicking structures 990 comprise a mesh layer. The mesh layer, for example, may include a mesh selected from the list consisting of copper mesh, stainless steel mesh, metal mesh, polymer mesh and copper-encapsulated mesh. The mesh layer, for example, may include a hydrophilic coating 995 or a hydrophobic coating or hermetic coating.

The term "substantially" means within 5% or 10% of the value referred to or within manufacturing tolerances.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

That which is claimed:

1. A thermal ground plane comprising:
    a first planar substrate member configured to enclose a working fluid, wherein the first planar substrate member comprises a polymer and copper, and wherein the first planar substrate member has a thickness less than 60 microns;
    a second planar substrate member configured to enclose the working fluid, wherein a perimeter of the first planar substrate member and a perimeter of the second planar substrate member are hermetically sealed together by thermo-compression bonding, wherein the second planar substrate member has a thickness less than 60 microns, wherein the second planar substrate member consists essentially of a metal;
    a first plurality of pillars disposed on an interior surface of the first planar substrate member;
    a mesh layer disposed on the top of the first plurality of pillars and bonded with the top of the first plurality of pillars, wherein the mesh layer consists essentially of copper, or polymer encapsulated with copper, or stainless steel encapsulated with copper; and
    a second plurality of pillars disposed on an interior surface of the second planar substrate member within an area defined by the perimeter of the second planar substrate member and the second plurality of pillars extend from the second planar substrate member to the mesh layer and are not in contact with the first planar substrate member, wherein the spacing between each pillar of the second plurality of pillars is larger than two times of the diameter of each pillar of the second plurality of pillars;
    wherein the thermal ground plane has a thickness less than 300 microns.

2. The thermal ground plane according to claim 1, wherein the first planar substrate member and/or the second planar substrate member comprise at least one of a polymer-coated metallic layer, a copper-cladded polymer layer with thermal vias, a copper-cladded polymer layer without thermal vias, a polymer layer encapsulated by a copper layer, a polymer layer encapsulated by a hydrophilic coating, and/or a polymer layer encapsulated by a hydrophobic coating.

3. The thermal ground plane according to claim 1, wherein the first plurality of pillars comprises copper pillars.

4. The thermal ground plane according to claim 1, wherein the first plurality of pillars comprises a plurality of copper pillars or channels.

5. The thermal ground plane according to claim 1, wherein one or more of the first plurality of pillars have a cross-section comprising a rectangular cross section, a circular cross section, and/or a star-shaped cross section.

6. The thermal ground plane according to claim 1, wherein the mesh layer comprises a mesh selected from the list consisting of copper mesh, polymer mesh encapsulated with copper, and copper-encapsulated stainless steel mesh.

7. The thermal ground plane according to claim 1, wherein the mesh layer includes a hydrophilic coating or a hydrophobic coating.

8. The thermal ground plane according to claim 1, wherein the first plurality of pillars are deposited using a lithographic patterning process.

9. The thermal ground plane according to claim 1, wherein the dimensions of the second plurality of pillars are different than the dimensions of the first plurality of pillars.

10. The thermal ground plane according to claim 1, wherein the thermal ground plane is flexible.

11. The thermal ground plane according to claim 1, wherein each of the first plurality of pillars extends from the interior surface of the first planar substrate member and wherein each of the first plurality of pillars is not in contact with the second planar substrate member.

12. The thermal ground plane according to claim 1, wherein the mesh layer comprises a hydrophilic coating that comprises one or more coatings consisting selected from the group consisting of copper, $Al_2O_3$, $TiO_2$, and $SiO_2$.

13. The thermal ground plane according to claim 1, wherein the mesh layer is bonded on the top of the first plurality of pillars.

14. The thermal ground plane according to claim 1, wherein the mesh layer comprises a woven mesh.

15. The thermal ground plane according to claim 1, wherein the second planar substrate layer comprises a metallic layer, a polymer-coated metallic layer, a metallic layer encapsulated by a hydrophilic coating, or a copper metallic layer encapsulated by a hydrophilic/hydrophobic coating.

16. The thermal ground plane according to claim 1, wherein the metal comprises copper.

17. The thermal ground plane according to claim 1, wherein the mesh layer comprises a plurality of mesh layers.

18. A thermal ground plane comprising:
    a first planar substrate member that encloses a working fluid, wherein the first planar substrate member comprises stainless steel and copper, and wherein the first planar substrate member has a thickness less than 60 microns;
    a second planar substrate member that encloses the working fluid, wherein a perimeter of the first planar substrate member and a perimeter of the second planar substrate member are hermetically sealed together by thermo-compression bonding, wherein the second planar substrate member has a thickness less than 60 microns, wherein the second planar substrate member consists essentially of a metal;
    a first plurality of pillars disposed on an interior surface of the first planar substrate member;
    a mesh layer disposed on the top of the first plurality of pillars and bonded with a top portion of the first plurality of pillars, wherein the mesh layer consists essentially of copper, or polymer encapsulated with copper, or stainless steel encapsulated with copper, and wherein the mesh layer comprises three or more mesh layers; and
    a second plurality of pillars disposed on an interior surface of the second planar substrate member within an area defined by the perimeter of the second planar substrate member, and the second plurality of pillars extend from the second planar substrate member to the mesh layer, and the second planar substrate member are not in contact with the first planar substrate member, wherein the spacing between each pillar of the second plurality of pillars is larger than two times of the diameter of each pillar of the second plurality of pillars.

19. The thermal ground plane according to claim 18, wherein each mesh layer of the three or more mesh layers comprises the same material as the other mesh layers of the three or more mesh layers.

20. The thermal ground plane according to claim 18, wherein each mesh layer of the three or more mesh layers comprises a different material than the other mesh layers of the three or more mesh layers.

21. The thermal ground plane according to claim 18, wherein the spacing between each pillar of the second plurality of pillars is larger than two times of the diameter of each pillar of the second plurality of pillars.

22. The thermal ground plane according to claim 18, wherein the perimeter of the first planar substrate member and the perimeter of the second planar substrate member are hermetically sealed together with a low temperature sintered interface.

23. The thermal ground plane according to claim 18, wherein the perimeter of the first planar substrate member and the perimeter of the second planar substrate member are hermetically sealed together by thermo-compression bonding.

24. The thermal ground plane according to claim 18, wherein the mesh layer is bonded on the top of the first plurality of pillars.

25. The thermal ground plane according to claim 18, wherein the mesh layer comprises a woven mesh.

26. A thermal ground plane comprising:
a first planar substrate member configured to enclose a working fluid, the first planar substrate member consists essentially of polymer and metal, and wherein the first planar substrate member has a thickness less than 60 microns;
a second planar substrate member configured to enclose the working fluid, wherein a perimeter of the first planar substrate member and a perimeter of the second planar substrate member are hermetically sealed together by thermo-compression bonding, wherein the second planar substrate member has a thickness less than 60 microns, wherein the second planar substrate member consists essentially of a polymer and metal;
a first plurality of pillars disposed on an interior surface of the first planar substrate member;
a mesh layer disposed on the top of the first plurality of pillars and bonded with the top of the first plurality of pillars, wherein the mesh layer consists essentially of copper, or polymer encapsulated with copper, or stainless steel encapsulated with copper; and
a second plurality of pillars disposed on an interior surface of the second planar substrate member within an area defined by the perimeter of the second planar substrate member, wherein each of the second plurality of pillars extend from the interior surface of the second planar substrate member to the mesh layer, and wherein the second plurality of pillars second are not in contact with the first planar substrate member, and wherein each of the second plurality of pillars is not in contact with the first planar substrate member.

27. The thermal ground plane according to claim 26, further comprising a mesh bonded with the first plurality of pillars.

28. The thermal ground plane according to claim 26, wherein a perimeter of the first planar substrate member and a perimeter of the second planar substrate member are hermetically sealed together using thermo-compression bonding.

29. The thermal ground plane according to claim 26, wherein the perimeter of the first planar substrate member and the perimeter of the second planar substrate member are hermetically sealed together with a low temperature sintered interface.

30. The thermal ground plane according to claim 26, wherein the mesh layer is bonded on the top of the first plurality of pillars.

31. The thermal ground plane according to claim 26, wherein the mesh layer comprises a woven mesh.

32. The thermal ground plane according to claim 26, wherein the metal comprises copper.

33. The thermal ground plane according to claim 26, wherein the mesh layer comprises a plurality of mesh layers.

* * * * *